United States Patent [19]

Park

[11] Patent Number: 5,792,694
[45] Date of Patent: Aug. 11, 1998

[54] METHOD FOR FABRICATING A SEMICONDUCTOR MEMORY CELL STRUCTURE

[75] Inventor: Jin Won Park, Chungcheongbuk-do, Rep. of Korea

[73] Assignee: LG Semicon Co., Ltd., Chungcheongbuk-Do, Rep. of Korea

[21] Appl. No.: 648,688

[22] Filed: May 16, 1996

[30] Foreign Application Priority Data

Feb. 28, 1996 [KR] Rep. of Korea ............... 1996/5003

[51] Int. Cl.[6] ................................................. H01L 21/336
[52] U.S. Cl. ........................... 438/257; 438/259; 438/698
[58] Field of Search .................................. 438/257, 258, 438/259, 261, 262, 276, 697, 698

[56] References Cited

U.S. PATENT DOCUMENTS

| | | | |
|---|---|---|---|
| 4,734,887 | 3/1988 | Sugatani | 365/185 |
| 4,795,719 | 1/1989 | Eitan | 437/43 |
| 5,120,671 | 6/1992 | Tang et al. | 437/43 |
| 5,380,676 | 1/1995 | Hsue et al. | 438/276 |
| 5,449,632 | 9/1995 | Hong | 438/276 |
| 5,536,669 | 7/1996 | Su et al. | 438/276 |
| 5,545,580 | 8/1996 | Sheng et al. | 438/276 |

*Primary Examiner*—Tuan H. Nguyen
*Attorney, Agent, or Firm*—Morgan, Lewis & Bockius LLP

[57] ABSTRACT

A semiconductor memory cell structure includes a semiconductor substrate, a plurality of field insulating layers on the semiconductor substrate along a first direction at a first interval, a plurality of floating gate electrodes on the semiconductor substrate between the field insulating layers, the floating gate electrodes being aligned with the field insulating layers, a plurality of control electrodes over the floating gate electrodes and the field insulating layer at a second interval along a second direction, and a plurality of impurity areas on the semiconductor substrate at both sides of the floating gate electrodes along the first direction between the field insulating layers.

7 Claims, 6 Drawing Sheets

METHOD FOR FABRICATING A SEMICONDUCTOR MEMORY CELL STRUCTURE

BACKGROUND OF THE INVENTION

1. Field of the Invention

The present invention relates to a semiconductor memory cell structure and a method for fabricating the same, and more particularly, to a semiconductor memory cell structure suitable for minimizing the memory cell area and a method for fabricating the same.

2. Discussion of the Related Art

The semiconductor industry has been trying very hard to enhance packing density and performance of semiconductor devices. Accordingly, many studies have been directed to fabricating semiconductor devices with reduced cell area. For example, a self-aligned cell structure using polysilicon, a self-aligned trench cell structure, and a self-aligned cell structure between source/drain and floating gate, are suggested under these studies. However, these suggested structures are not suitable for practical use due to their complicated manufacturing processes and unstable characteristics.

A conventional semiconductor memory cell structure and the corresponding fabricating method will now be discussed with reference to FIGS. 1, 2 and 3. FIG. 1 is a layout of a conventional semiconductor memory cell. FIG. 2 is a sectional view of the conventional semiconductor memory cell along line I–I' of FIG. 1. FIG. 3 is a sectional view of the conventional memory cell along line II–II' of FIG. 1.

As shown in FIGS. 1 through 3, field insulating layers 1 are formed on a semiconductor substrate 5 at a predetermined interval along one direction (hereinafter referred to as the column direction). Floating gate electrodes 2 for accumulating charges are formed on the semiconductor substrates 5 in the spaces between the field insulating layers 1 and on part of the field insulating layers 1. Control electrodes 3 are then formed perpendicular to the column direction at a predetermined interval (this direction will be referred to as the row direction hereinafter). A plurality of impurity areas 4 are formed on both sides of the floating gate electrodes 2 in the column direction between the field insulating layers 1.

FIG. 2 illustrates a section of the semiconductor memory cell structure shown along the direction of the control electrodes (along line I–I' of FIG. 1). As shown in FIG. 2, a plurality of the field insulating layers 1 are formed on the semiconductor substrate 5 at a predetermined interval. A first gate insulating layer 6 is formed on the semiconductor substrate 5 between the respective field insulating layers 1. The floating gate electrode 2 is formed on the first gate insulating layer 6 and also on part of the field insulating layer 1. A second gate insulating layer 7 is then formed on the overall surface of the floating gate electrode 2 and the field insulating layer 1. The control electrode 3 is formed on the second gate insulating layer 7.

FIG. 3 illustrates a section of the semiconductor device shown along the column direction where the floating gate electrodes 2 are located (along line II–II' of FIG. 1). As shown in FIG. 3, a plurality of the first gate insulating layers 6 and the floating gate electrodes 2 are formed on the semiconductor substrate 5 at a predetermined interval. The second gate insulating layer 7 and the control electrode 3 are then formed on the floating gate electrodes 2. The impurity area 4 is formed on both sides of the floating gate electrodes 2.

A fabricating method for the conventional semiconductor memory cell as described above will now be explained. FIGS. 4A–4D are sectional views showing the manufacturing process of the conventional semiconductor memory cell, along line I–I' of FIG. 1. FIGS. 5A–5E are sectional views for the manufacturing process of the conventional semiconductor memory cell shown along line II–II' of FIG. 1.

As shown in FIGS. 4A and 5A, a field insulating layer 1 is deposited on a semiconductor substrate 5, and then selectively removed by photolithography and etching so that selected areas of the semiconductor substrate 5 are exposed.

Referring to FIGS. 4B and 5B, the exposed areas of the semiconductor substrate 5 is then thermally oxidized to form a first gate insulating layer 6. Next, a floating gate semiconductor layer 2a is deposited on the overall surface of the field insulating layer 1 and the first gate insulating layer 6.

Turning to FIGS. 4C and 5C, the floating gate semiconductor layer 2a is then selectively removed by photolithography and etching to form a floating gate electrode 2. Next, a second gate insulating layer 7 is formed on the overall surface of the floating gate electrode 2 and the field insulating layer 1.

Referring to FIGS. 4D and 5D, a control electrode semiconductor layer 3 is formed on the second gate insulating layer 7, and then selectively removed by photolithography and etching to thereby form a control electrode 3.

In FIG. 5E, the first gate insulating layer 6, the second gate insulating layer 7, and the floating gate electrode 2 are etched by using the control electrode 3 as a mask so that portions of the semiconductor substrate 5 are exposed. Impurity ions are then injected into the exposed portions of the semiconductor substrate 5 to form an impurity area 4.

However, the conventional semiconductor memory cell structure and the method for fabricating the same have the following problems.

First, since the floating gate electrode is formed through a photo-etching process, a superposed section between the floating gate electrode and the field insulating layer is required due to a tolerance requirement of such photo-etching process. This increases the cell area and hinders high-density packing of a semiconductor device. Second, multiple photo-etching processes are required during the fabrication, thus making the manufacturing process complicated and undesirable.

SUMMARY OF THE INVENTION

Accordingly, the present invention is directed to a semiconductor memory cell structure and method for fabricating the same that substantially obviates one or more of the problems due to limitations and disadvantages of the related art.

An object of the present invention is to provide a semiconductor memory cell structure and a method for fabricating the same with minimized cell area and simplified manufacturing process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a semiconductor memory cell structure of the present invention includes a semiconductor substrate, a plurality of field insulating layers on the semiconductor substrate along a first direction at a first interval, a plurality of floating gate electrodes on the semiconductor substrate between the field insulating layers, the floating gate electrodes being aligned with the field insulating layers, a plurality of control electrodes over the floating gate electrodes and the field insulating layer at a second interval along a second direction; and a plurality of impurity areas on the semiconductor substrate at both sides of the floating gate electrodes along the first direction between the field insulating layers.

In another aspect, a method for fabricating a semiconductor memory cell structure having a semiconductor substrate includes the steps of forming a field insulating layer on a portion of the semiconductor substrate, depositing sequentially a floating gate semiconductor layer and a floating layer on the field insulating layer and the semiconductor substrate, etching the floating layer and the floating gate semiconductor layer for planarization, and forming a plurality of self-aligned floating gate electrodes on the semiconductor substrate between the field insulating layer, forming a plurality of control electrodes over the floating gate electrodes and field insulating layers at an interval and perpendicular to the floating gate electrodes, and forming a plurality of impurity areas on the semiconductor substrate at both sides of the floating gate electrodes between the field insulating layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 6:
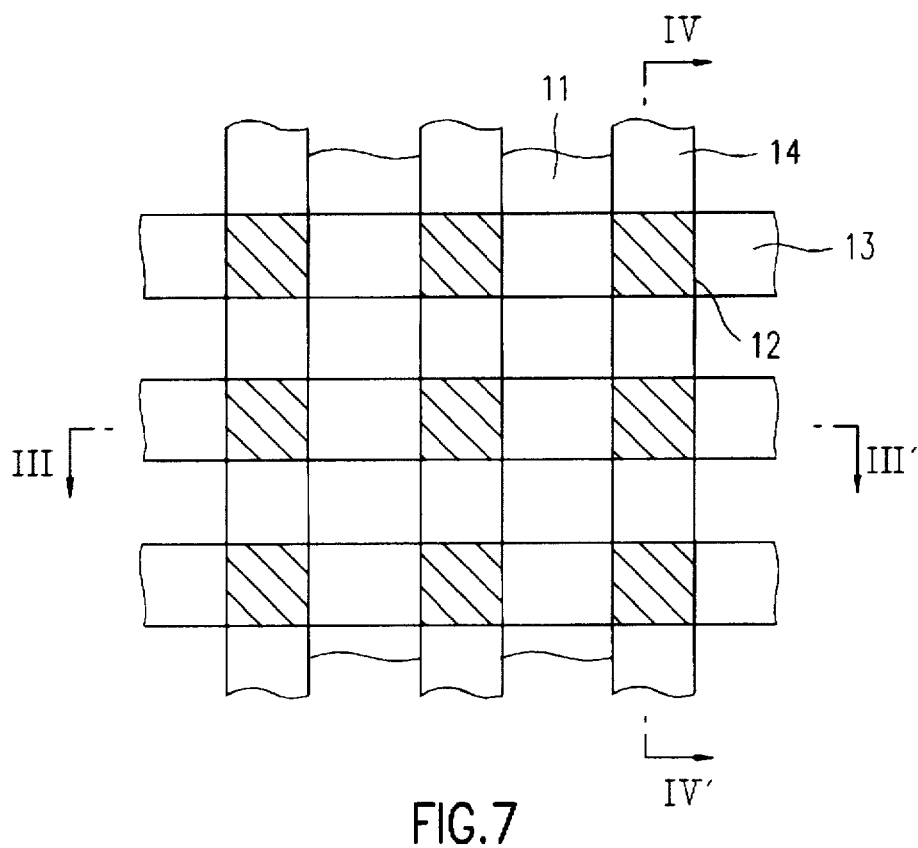
FIG. 6 is a layout of a semiconductor memory cell according to the present invention.
Figure 7:
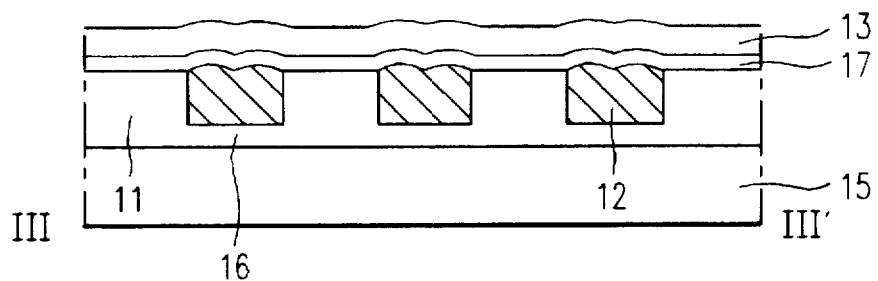
FIG. 7 is a sectional view of the memory cell according to the present invention along line III–III' of FIG. 6.
Figure 8:
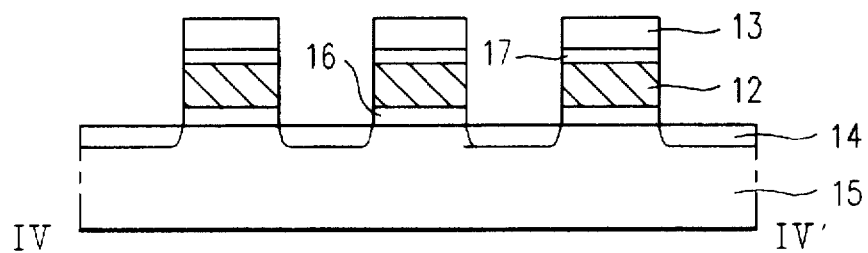
FIG. 8 is a sectional view of the memory cell according to the present invention along line IV–IV' of FIG. 6.

A preferred embodiment for a semiconductor memory cell structure according to the present invention and the corresponding manufacturing method will now be described in detail. Referring to FIGS. 6 through 8, field insulating layers 11 are formed on a semiconductor substrate 15 at a predetermined interval along one direction (hereinafter referred to as the column direction). Floating gate electrodes 12 for accumulating charges are formed in self-alignment (i.e., the top of the floating gate electrode 12 being aligned with the top of the field insulating larger 11) on the semiconductor substrate 15 in the spaces between the field insulating layers 11. Control electrodes 13 are then formed perpendicular to the column direction at a predetermined interval (this direction will be referred to as the row direction hereinafter). A plurality of impurity areas 14 are formed on both sides of the floating gate electrodes 12 in the column direction between the field insulating layers 11.

FIG. 7 illustrates a section of the semiconductor device shown along the direction of the control electrodes (along line III–III' of FIG. 6). As shown in FIG. 7, a plurality of the field insulating layers 11 are formed on the semiconductor substrate 15 at a predetermined interval. A first gate insulating layer 16 is formed between the respective field insulating layers 11. The floating gate electrode 12 is formed in self-alignment on the first gate insulating layer 16 and between the field insulating layers 11. The top of the floating gate electrode 12 is aligned with the top of the field insulating layer 11. A second gate insulating layer 17 is formed on the overall surface of the floating gate electrode 12 and the field insulating layer 11. The control electrode 13 is formed on the second gate insulating layer 17.

FIG. 8 illustrates a section of the semiconductor device shown along the column direction where the floating gate electrodes 12 are located (along line IV–IV' of FIG. 6). As shown in FIG. 8, a plurality of the first gate insulating layers 16 and the floating gate electrodes 12 are formed on the semiconductor substrate 15 at a predetermined interval. The second gate insulating layer 17 and the control electrode 13 are then formed on the floating gate electrodes 12. The impurity area 14 is formed on both sides of the floating gate electrodes 12.

A fabricating method for the semiconductor memory cell of the present invention as described above will now be explained with reference to FIGS. 9A–9D and FIGS. 10A–10E.

Figure 9A:
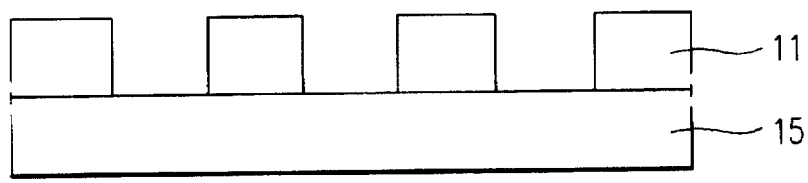
FIGS. 9A–9D are sectional views illustrating the fabrication process of the memory cell according to the present invention along line III–III' of FIG. 6.
Figure 10A:
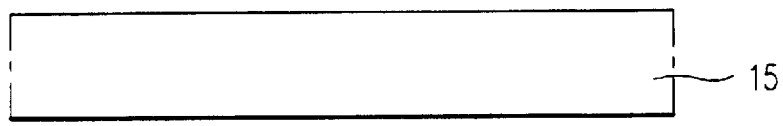
FIGS. 10A–10E are sectional views illustrating the fabrication process of the memory cell according to the present invention along line IV–IV' of FIG. 6.

As shown in FIGS. 9A and 10A, a field insulating layer 11 is deposited on a semiconductor substrate 15, and then selectively removed by photolithography and etching so that certain areas of the semiconductor substrate 15 are exposed.

Figure 9B:
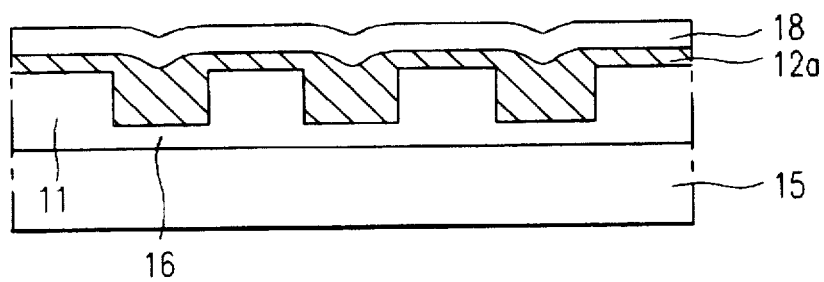
Figure 9C:
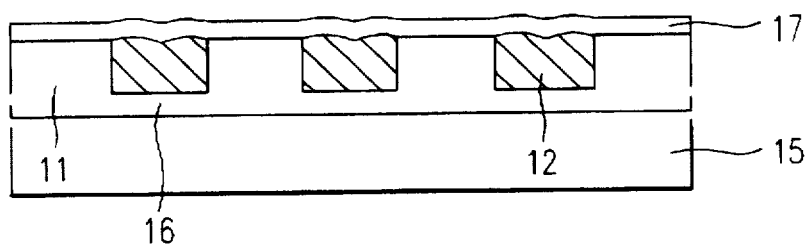
Figure 10B:
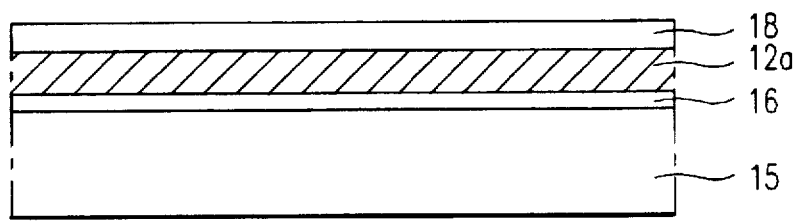
Figure 10C:
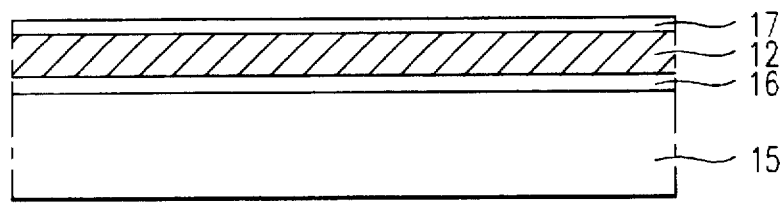

Referring to FIGS. 9B and 10B, the exposed areas of the semiconductor substrate 15 are thermally oxidized to form a first gate insulating layer 16. Next, a floating gate semiconductor layer 12a is deposited on the overall surface of the field insulating layer 11 and the first gate insulating layer 16. A floating layer 18 (SOG) is coated on the floating gate semiconductor layer 12a, and then etched back to planarize the floating gate semiconductor layer 12a and form a floating gate electrode 12. Here, the floating gate semiconductor layer 12a is planarized so that the floating gate electrode 12 of self-alignment has the same step height as the field insulating layer 11, as shown in FIGS. 9C and 10C. Then, a second gate insulating layer 17 is formed on the overall surface of the floating gate electrode 12 and the field insulating layer 11.

Figure 9D:
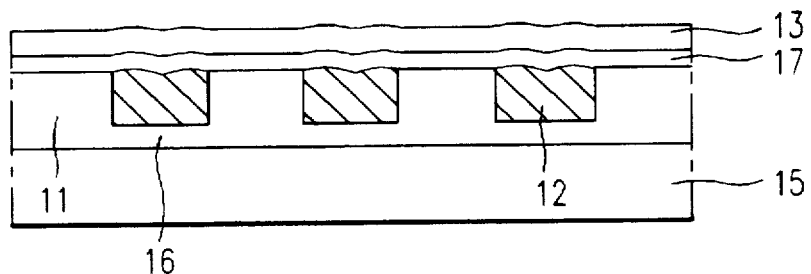
Figure 10D:
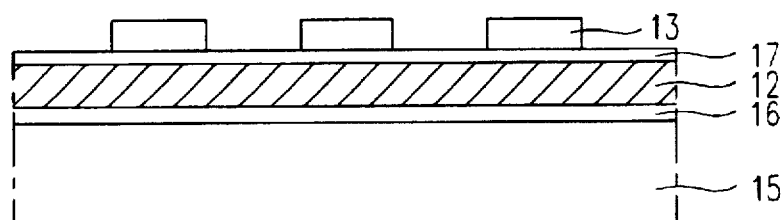

Referring to FIGS. 9D and 10D, a control electrode semiconductor layer 13 is formed on the second gate insulating layer 17, and then selectively removed by photolithography and etching to thereby form a control electrode 13.

Figure 10E:
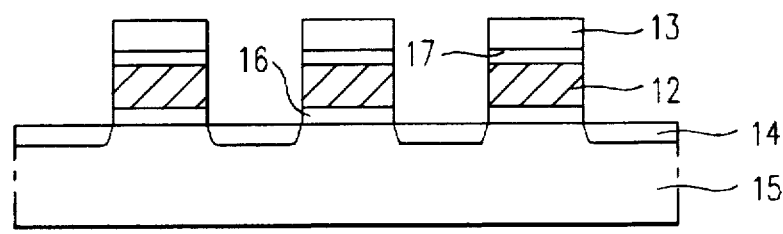

As shown in FIG. 10E, the first gate insulating layer 16, the second gate insulating layer 17, and the floating gate electrode 12 are then etched by using the control electrode 13 as a mask to expose portions of the semiconductor substrate 15. Next, impurity ions are injected into the exposed portions of the semiconductor substrate 15 to form an impurity area 14.

The semiconductor memory cell structure of the present invention and the corresponding manufacturing method has the following advantages.

Figure 1:
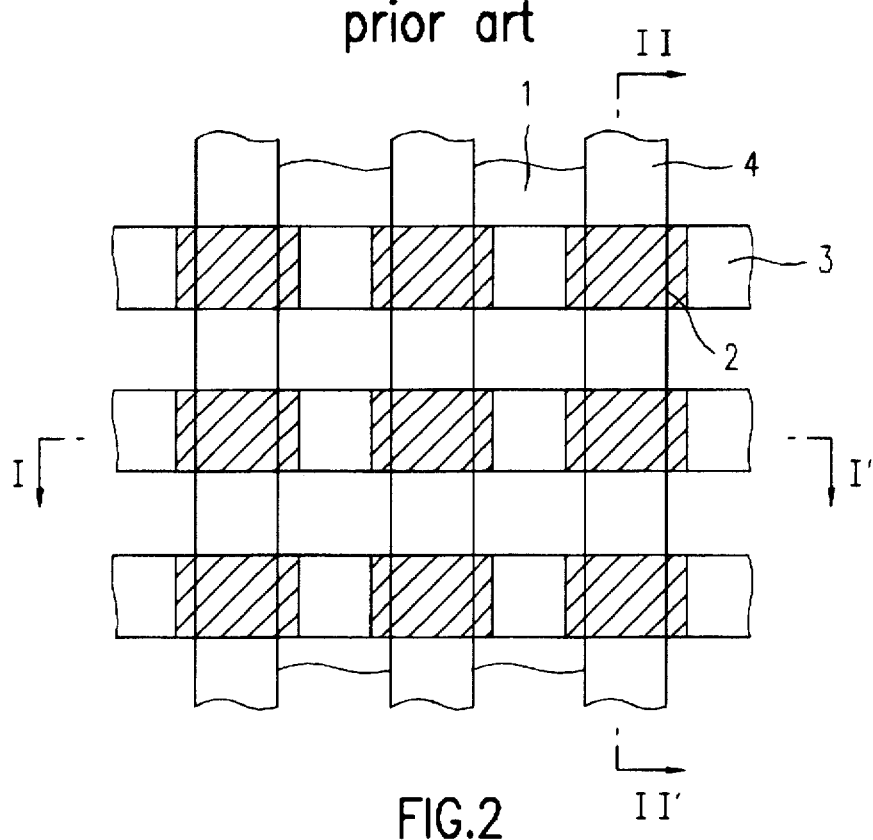
FIG. 1 is a layout of a conventional semiconductor memory cell.
Figure 2:
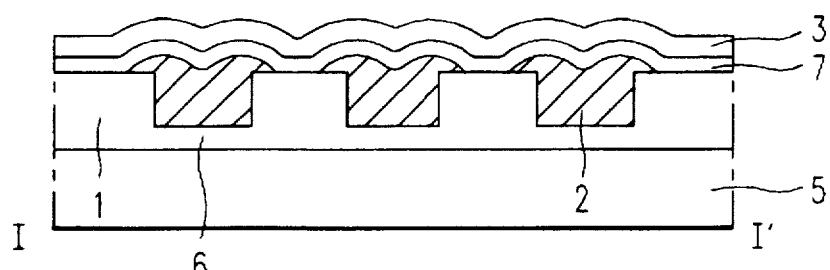
FIG. 2 is a sectional view of the conventional semiconductor memory cell along line I–I' of FIG. 1.
Figure 3:
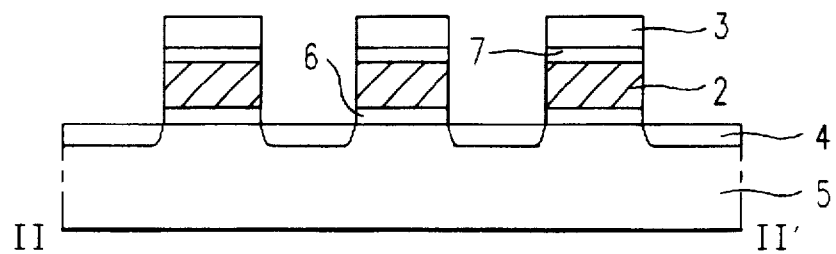
FIG. 3 is a sectional view of the conventional semiconductor memory cell along line II–II' of FIG. 1.
Figure 4A:
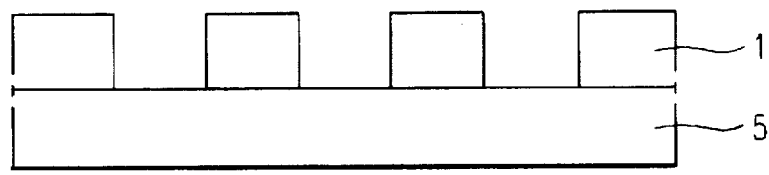
FIGS. 4A–4D are sectional views illustrating the fabrication process of the conventional memory cell along line I–I' of FIG. 1.
Figure 4B:
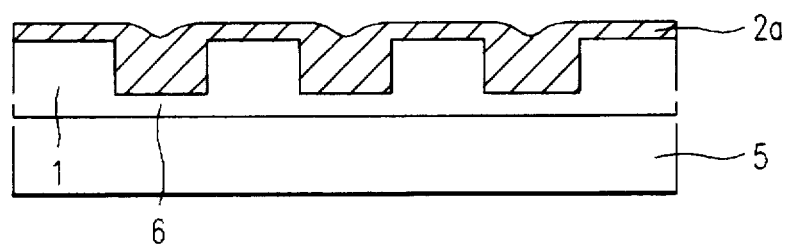
Figure 4C:
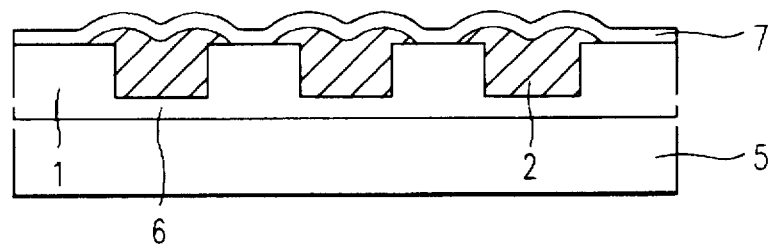
Figure 4D:
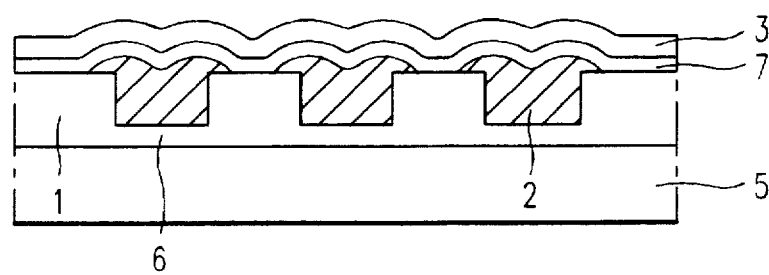
Figure 5A:
FIGS. 5A–5E are sectional views illustrating the fabrication process of the conventional memory cell along line II–II' of FIG. 1.
Figure 5B:
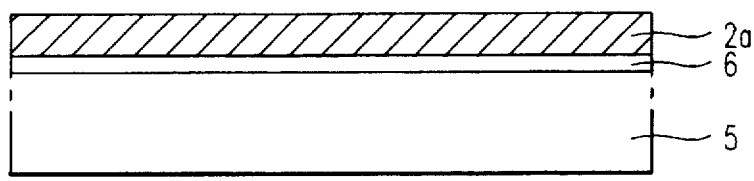
Figure 5C:
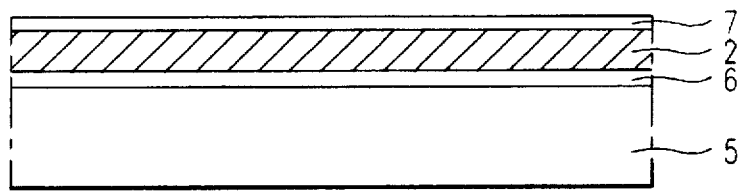
Figure 5D:
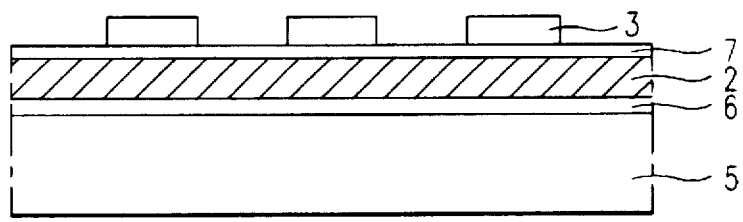
Figure 5E:
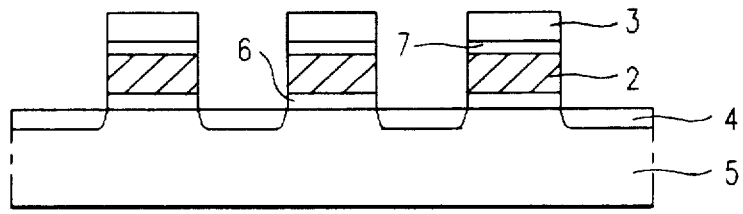

First, no photo-etching process is needed to form the floating gate electrode, thus simplifying the manufacturing process. Second, since the tolerance required by the photo-etching is no longer needed, the superposed section (as shown in FIGS. 1-2) between the floating gate electrode and the field insulating layer is eliminated, allowing reduced cell area and increased packing density.

It will be apparent to those skilled in the art that various modifications and variations can be made in the semiconductor memory cell structure of the present invention and the fabricating method without departing from the spirit or scope of the invention. Thus, it is intended that the present invention cover the modifications and variations of this invention provided they come within the scope of the appended claims and their equivalents.

What is claimed is:

1. A method for fabricating a semiconductor memory cell structure having a semiconductor substrate, the method comprising the steps of:

forming a field insulating layer on a portion of the semiconductor substrate;

depositing sequentially a floating gate semiconductor layer and a floating layer on the field insulating layer and the semiconductor substrate;

etching the floating layer and the floating gate semiconductor layer for planarization, and forming a plurality of self-aligned floating gate electrodes on the semiconductor substrate between the field insulating layer;

forming a plurality of control electrodes over the floating gate electrodes and field insulating layers at an interval and perpendicular to the floating gate electrodes; and forming a plurality of impurity areas on the semiconductor substrate at both sides of the floating gate electrodes between the field insulating layers.

2. A method for fabricating a semiconductor memory cell structure having a semiconductor substrate, the method comprising the steps of:

forming a field insulating layer on a portion of the semiconductor substrate;

depositing sequentially a floating gate semiconductor layer and a floating layer on the field insulating layer and the semiconductor substrate;

etching the floating layer and the floating gate semiconductor layer for planarization, and forming a plurality of floating gate electrodes on the semiconductor substrate between the field insulating layer;

forming a plurality of control electrodes over the floating gate electrodes and field insulating layer; and forming a plurality of impurity areas on the semiconductor substrate on at least one side of the floating gate electrodes between the field insulating layer.

3. The method as claimed in claim 2, wherein the step of forming the control electrodes includes the steps of:

forming a control electrode semiconductor layer over the floating gate electrodes and the field insulating layer; and etching the control electrode semiconductor layer selectively to form the control electrodes perpendicular to the floating gate electrodes.

4. The method as claimed in claim 2, wherein the step of forming the field insulating layers includes the steps of:

depositing an insulating layer on the semiconductor substrate; and etching the insulating layer selectively to expose an area of the semiconductor substrate.

5. The method as claimed in claim 2, wherein the step of forming the floating gate electrodes includes the step of aligning the floating gate electrodes with the field insulating layers.

6. The method as claimed in claim 2, wherein the floating layer includes an SOG layer.

7. The method as claimed in claim 2, wherein the step of forming the impurity areas includes the steps of:

etching the floating gate electrodes by using the control electrodes as a mask to expose a portion of the semiconductor substrate; and injecting impurity ions to the exposed portion of the semiconductor substrate.

* * * * *